(12) United States Patent
Zitlaw et al.

(10) Patent No.: US 6,707,747 B2
(45) Date of Patent: Mar. 16, 2004

(54) DYNAMIC INPUT THRESHOLDS FOR SEMICONDUCTOR DEVICES

(75) Inventors: Cliff Zitlaw, San Jose, CA (US); Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/190,648

(22) Filed: Jul. 8, 2002

(65) Prior Publication Data

US 2004/0004896 A1 Jan. 8, 2004

(51) Int. Cl.[7] .................................................. G11C 7/00
(52) U.S. Cl. ........................ 365/227; 365/229; 327/544
(58) Field of Search .............................. 365/233, 227, 365/189.05, 229; 327/333, 544

(56) References Cited

U.S. PATENT DOCUMENTS

| | | | |
|---|---|---|---|
| 4,683,382 A | * 7/1987 | Sakurai et al. | 327/544 |
| 5,438,549 A | * 8/1995 | Levy | 365/229 |
| 5,615,159 A | 3/1997 | Roohparvar | |
| 5,723,990 A | 3/1998 | Roohparvar | |
| 5,790,459 A | 8/1998 | Roohparvar | |
| 6,101,144 A | * 8/2000 | Jo | 365/229 |
| 6,147,540 A | * 11/2000 | Coddington | 327/333 |
| 6,310,809 B1 | 10/2001 | Roohparvar | |
| 6,327,202 B1 | 12/2001 | Roohparvar | |
| 6,359,821 B1 | 3/2002 | Roohparvar | |
| 6,507,525 B1 | 1/2003 | Nobunaga | |

* cited by examiner

*Primary Examiner*—Son Mai
(74) *Attorney, Agent, or Firm*—Leffert Jay & Polglaze, P.A.

(57) ABSTRACT

A memory and system reduce power consumption by reducing a power supply level. The memory includes input circuitry coupled to a data communication bus. The input circuitry has first and second threshold detection levels to detect voltage transitions of data signals communicated on the bus. The memory device changes threshold voltage detection levels in synchronization with other memories coupled to the bus. In one embodiment, the synchronization is performed while the memory devices are in a power down state. A power supply provided to the memory device is changed while the memory is in the power-down state.

23 Claims, 2 Drawing Sheets

DYNAMIC INPUT THRESHOLDS FOR SEMICONDUCTOR DEVICES

FIELD OF THE INVENTION

The present invention relates generally to integrated circuits and in particular the present invention relates to supply input levels for integrated circuits.

BACKGROUND OF THE INVENTION

Manufacturers of electronic devices, such as handheld products, are under constant pressure to reduce power consumption. One technique used to reduce power is to reduce operating voltage levels. Further, a reduction in the operating voltage levels of data buses can provide significant reductions in power consumption. That is, power dissipated during a transfer of data is proportional to the capacitance of the bus and the square of the switched voltage levels ($P=kCV^2$). The $V^2$ term indicates that any reduction in operating voltage for the bus has a dramatic change in the power consumption.

Reducing data bus operating voltages can reduce the bandwidth of the bus. That is, the input/output (I/O) circuitry coupled to the data bus typically exhibits reduced performance at lower operating voltages. For the reasons stated above, and for other reasons stated below which will become apparent to those skilled in the art upon reading and understanding the present specification, there is a need in the art for an integrated circuit that can have a reduced power consumption while still allowing for higher data bandwidth.

SUMMARY OF THE INVENTION

The above-mentioned problems with integrated circuits and other problems are addressed by the present invention and will be understood by reading and studying the following specification.

In one embodiment, a communication system comprises a controller, a data communication bus, and a memory device coupled to the controller via the data communication bus. The memory device comprises an input circuit coupled to the data communication bus to detect a voltage signal on the bus. The input circuit has first and second voltage threshold settings that are selected based on externally provided commands from the controller.

In another embodiment, a memory device comprises an input connection to receive input voltage signals, an input circuit coupled to the input connection and comprising a threshold voltage detection circuit, and command control circuitry to change a threshold voltage detection level of the input circuit in response to an externally provided command sequence.

A synchronous non-volatile memory device comprises a clock input signal connection, a clock enable signal input connection (CKE), a data input connection to receive data input voltage signals, and an input circuit coupled to the data input connection and comprising a threshold voltage detection circuit. Command control circuitry changes a threshold voltage detection level of the input circuit in response to an externally provided command and a power-down operation.

A method of operating a memory device comprises instructing the memory to change an input signal threshold voltage in response to receiving a synchronization signal, changing a supply voltage provided to the memory device, receiving the synchronization signal after the supply voltage is changed, and changing the input signal threshold voltage.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Embodiments of the present invention allow an integrated circuit to dynamically adjust the data bus input voltage threshold levels. Lower voltage operation can be selected when data bandwidth requirements are small, and a higher voltage operation can be selected when the data bandwidth requirements increase.

The integrated circuit of the present invention can be any type of integrated circuit. In one embodiment the integrated circuit is a memory device. Numerous different memory devices are available for different applications, and the present invention is not limited to any one style. The memory can be dynamic random access memory (DRAM) or a synchronous DRAM (SDRAM) that can run at much higher clock speeds than conventional DRAM memory. SDRAM synchronizes itself with a clock bus. SDRAMs can be accessed quickly, but are volatile. The integrated circuit can be a flash memory device in one embodiment.

Figure 1:
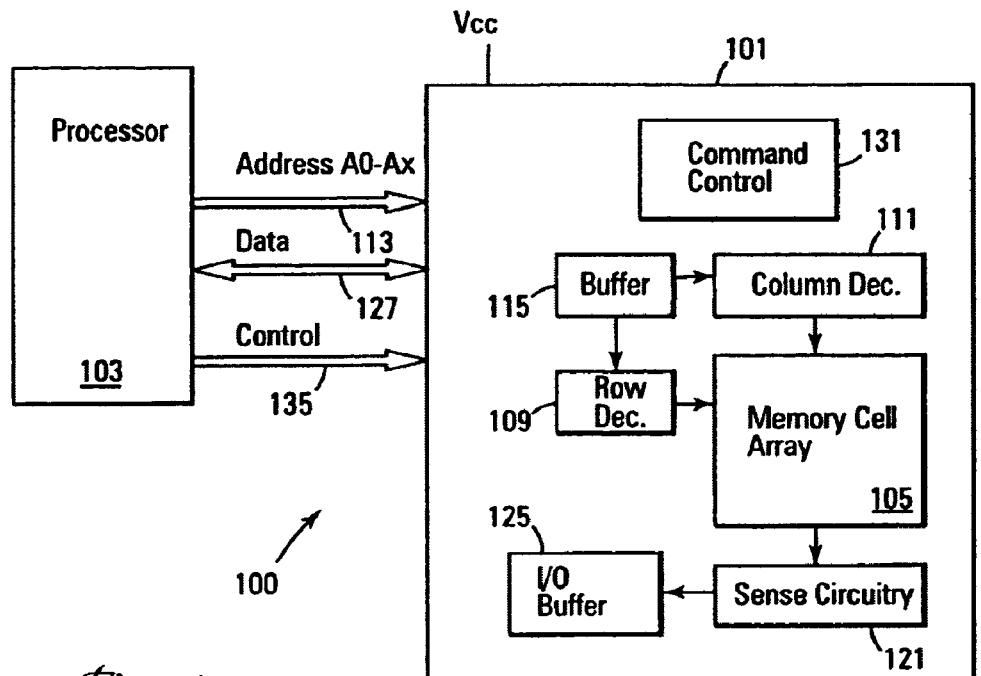
FIG. 1 is a functional block diagram of a flash memory device according to one embodiment of the present invention that is coupled to a processor.

FIG. 1 is a functional block diagram of a flash memory device 101, of one embodiment of the present invention, that is coupled to a processor 103, or controller. The memory device 101 and the processor 103 may form part of an electronic system 100. The memory device 101 has been simplified to focus on features of the memory that are helpful in understanding the present invention. The memory device 101 includes an array of memory cells 105. The memory cells are preferably non-volatile floating-gate memory cells and generally have their control gates coupled to word lines, drain regions coupled to local bit lines, and source regions commonly coupled to a ground potential. The memory array 105 is arranged in rows and columns, with the rows arranged in blocks. The memory cells generally can be erased in blocks. Data, however, may be stored in the memory array 105 separate from the block structure.

An address buffer circuit 115 is provided to latch address signals provided on address lines A0–Ax 113. Address signals are received and decoded by row decoder 109 and a column decoder 111 to access the memory array 105. Sensing circuitry 121 is used to sense and amplify data stored in the memory cells. Data input and output buffer circuitry 125 is included for bi-directional data communication over a plurality of data (DQ) lines 127 with the processor 103.

Command control circuit 131 decodes signals provided on control lines 135 from the processor 103. These signals are used to control the operations on the memory array 105, including data read, data write, and erase operations. Command control is also used to enter a test mode, or operation, in response to external commands. As stated above, the flash memory device 101 has been simplified to facilitate a basic understanding of the features of the memory. A more detailed understanding of flash memories is known to those skilled in the art.

The present invention is applicable to numerous different integrated circuits including memory devices. One type of memory devices are synchronous memories. SDRAM's are, well known in the art. Similarly, synchronous non-volatile flash memories are known, see "Protection after brown out in a synchronous memory" U.S. Pat. No. 6,246,626 to Roohparvar, issued Jun. 12, 2001 for a description of a synchronous flash memory.

Figure 2:
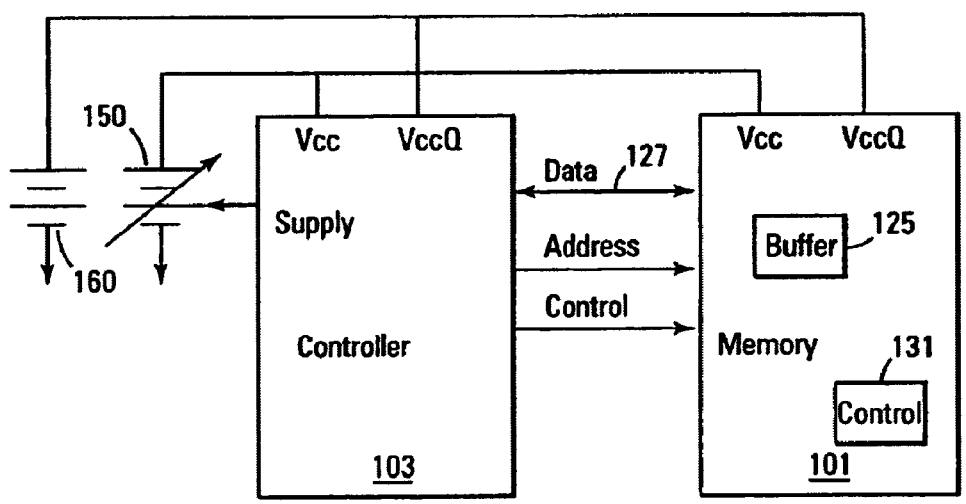
FIG. 2 is a block diagram of a controller and memory of an embodiment of the present invention.

Referring to FIG. 2, a block diagram of controller 103 and memory device 101 are described. The controller is coupled to provide commands and addresses to the memory device. Bi-directional data is communicated between the devices on data lines 127, or bus. Two different power supplies are coupled to the controller and memory. One supply 150, Vcc, provides the standard operating voltage, while the second supply 160, VccQ, is adjustable to provide a reduced operating voltage. Controller 103 adjusts the VccQ supply, as explained below.

When the lower supply voltage VccQ is to be used, such as a standby mode, the controller instructs the memory(s) to change input threshold values of I/O buffer 125. Because multiple circuits can be coupled to the same data bus, this instruction is executed in a synchronized manner to switch to the new input threshold using an event that causes the controller and all peripheral devices to simultaneously make the transition to the operating level. Thus, command control 131 changes the threshold values and synchronizes the changes.

Figure 3:
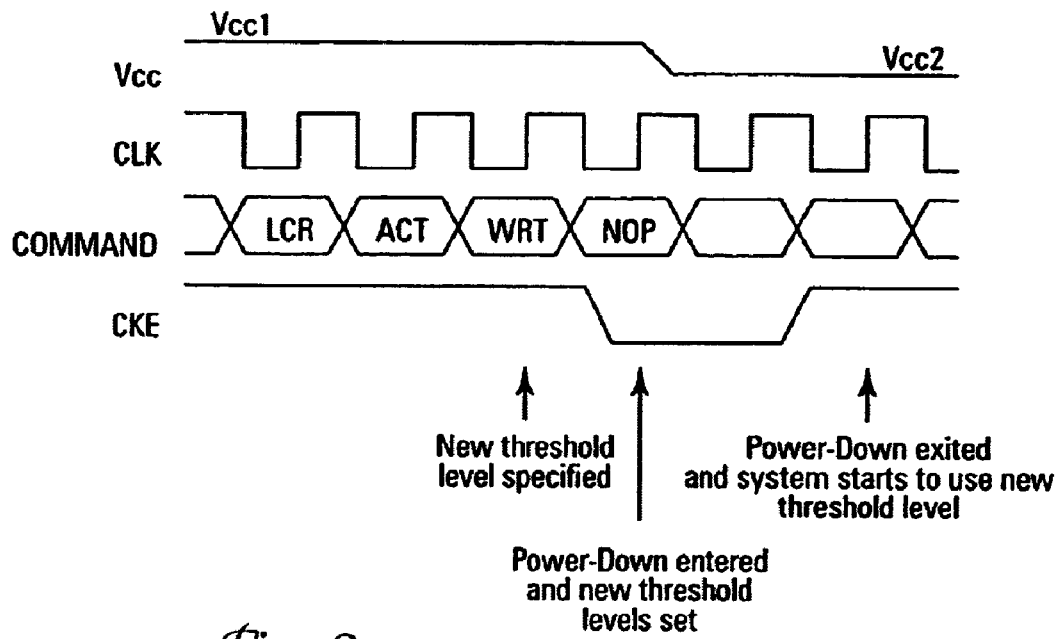
FIG. 3 illustrates an example timing of one embodiment of the present invention.

Referring to FIG. 3, an example timing of one embodiment is described. The method can be described as a two-step operation. The first step is a command to the memories coupled to the data bus. The command includes a load command register (LCR) command, followed by an activated command (ACT) and then a write command (WRT) where the new threshold level is specified. Following the command(s), the second step switches the new threshold level when the bus is idle. One example of synchronizing the change uses a "power-down" mode. For synchronous memories, volatile or non-volatile, power-down is entered by bring clock enable (CKE) low with a NOP (no operation) command. When the memory enters the power-down mode during the change-threshold command, the internal threshold levels of the memory device are changed. During this time period the controller thresholds are also changed. Further, the controller can also change the VccQ level to the new reduced voltage during this time. When the CKE signal returns to a high state, the memories and controller operate using the lower threshold levels for the new VccQ supply.

The above example depends on a single low to high transition of CKE to resume normal operation at the new threshold. A low voltage level typically does not change significantly from one threshold to another. In contrast, the high level has a much more significant shift when changing between thresholds.

Figure 4:
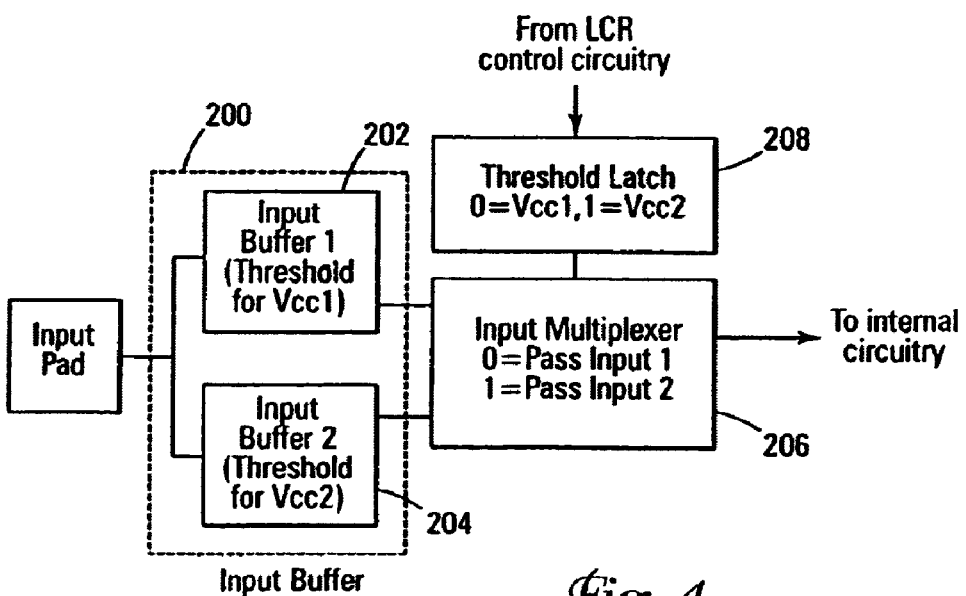
FIG. 4 illustrates one embodiment of a circuit used to control the threshold voltage input circuitry coupled to a data bus.

The present invention is not limited to any one design of the circuitry used to set the threshold levels. FIG. 4 illustrates one embodiment of a circuit used to control the threshold voltage input circuitry coupled to a data bus. The circuitry includes an input buffer circuitry 200 with a first buffer 202 at a first threshold (Vcc1) and a second buffer 204 at a second threshold (Vcc2). The buffers are coupled to a multiplex circuit 206 that is controlled in response to a latch 208. The latch selects one of buffers 202 or 204 to couple through the multiplex circuit 206. The latch is set according to the threshold level specified with the external command.

CONCLUSION

A memory and system have been described to reduce power consumption. The memory includes input circuitry coupled to a data communication bus. The input circuitry has first and second threshold detection levels to detect voltage transitions of data signals communicated on the bus. The memory device changes threshold voltage detection levels in synchronization with other memories coupled to the bus. In one embodiment, the synchronization is performed while the memory devices are in a power down state. A power supply provided to the memory device is changed while the memory is in the power-down state.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A communication system comprising:

a controller;

a data communication bus; and a memory device coupled to the controller via the data communication bus, the memory device comprises an input circuit coupled to the data communication bus to detect a voltage signal on the bus, the input circuit has first and second voltage threshold settings that are selected based on externally provided commands from the controller.

2. The communication system of claim 1 wherein the commands comprise:

a first command instructing the memory to change from the first to second voltage threshold setting when a second synchronizing command is performed by the memory device.

3. The communication system of claim 2 wherein the second synchronizing command instructs the memory device to execute a power-down operation.

4. The communication system of claim 3 wherein the memory device implements the second threshold voltage setting at an end of the power-down operation.

5. The communication system of claim 1 wherein the memory device is a synchronous memory.

6. The communication system of claim 1 wherein the input circuit comprises:

a first input buffer having the first voltage threshold;

a second input buffer having the second voltage threshold; and a multiplex circuit coupled to the first and second input buffers.

7. A memory device comprising:

an input connection to receive input voltage signals;

an input circuit coupled to the input connection and comprising a threshold voltage detection circuit; and command control circuitry to change a threshold voltage detection level of the input circuit in response to an externally provided command sequence.

8. The memory device of claim 7 wherein the command sequence comprises a threshold command followed by a synchronizing command.

9. The memory device of claim 8 wherein the synchronizing command is a power down command.

10. The memory device of claim 9 wherein the power down command comprises an inactive clock enable signal (CKE), and the threshold voltage detection level is changed in response to a subsequent active transition of CKE.

11. The memory device of claim 7 wherein the input circuit comprises:

a first input buffer having the first voltage threshold;

a second input buffer having the second voltage threshold; and a multiplex circuit coupled to the first and second input buffers.

12. A synchronous non-volatile memory device comprising:

a clock input signal connection;

a clock enable signal input connection (CKE);

a data input connection to receive data input voltage signals;

an input circuit coupled to the data input connection and comprising a threshold voltage detection circuit; and command control circuitry to change a threshold voltage detection level of the input circuit in response to an externally provided command and a power-down operation.

13. The synchronous non-volatile memory device of claim 12 wherein the threshold detection circuit comprises:

a first input buffer having the first voltage threshold;

a second input buffer having the second voltage threshold; and a multiplex circuit coupled to the first and second input buffers.

14. The synchronous non-volatile memory device of claim 12 wherein the command control circuitry changes the threshold voltage detection level upon a completion of the power-down operation.

15. A method of operating a memory device comprising:

instructing the memory to change an input signal threshold voltage in response to receiving a synchronization signal;

changing a supply voltage provided to the memory device;

receiving the synchronization signal after the supply voltage is changed; and changing the input signal threshold voltage.

16. The method of claim 15 wherein the synchronization signal is a power-down signal and the input signal threshold voltage is changed during a power-down operation.

17. The method of claim 15 wherein the memory is instructed to change the input signal threshold voltage with a command provided by an external controller.

18. A method of operating a memory device comprising:

receiving an externally provided command to change a voltage threshold of an input signal circuit; and changing the voltage threshold of the input signal circuit in response to a synchronization operation.

19. The method of claim 18 wherein the memory device is a synchronous memory device and the synchronization operation is a power-down operation.

20. A method of operating a communication system comprising:

transmitting instructions from a controller to a plurality of memory circuits to change a threshold voltage level of internal input voltage detection circuitry coupled to a common data bus;

changing a supply voltage coupled to the plurality of memory devices; and performing a synchronization operation to change the voltage threshold levels of the plurality of memory devices.

21. The method of claim 20 wherein the synchronization operation is a power-down operation.

22. The method of claim 21 wherein the controller changes the supply voltage while the plurality of memory devices are in a power-down state.

23. The method of claim 20 wherein the plurality of memory devices are synchronous non-volatile memory devices.

* * * * *